(12) United States Patent
Kim

(10) Patent No.: US 10,453,710 B2
(45) Date of Patent: Oct. 22, 2019

(54) APPARATUS FOR MANUFACTURING FLEXIBLE DISPLAY DEVICE

(71) Applicant: SAMSUNG DISPLAY CO., LTD., Yongin, Gyeonggi-Do (KR)

(72) Inventor: Hyun Chuel Kim, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 669 days.

(21) Appl. No.: 14/800,973

(22) Filed: Jul. 16, 2015

(65) Prior Publication Data

US 2016/0202728 A1   Jul. 14, 2016

(30) Foreign Application Priority Data

Jan. 14, 2015  (KR) .......................... 10-2015-0007026

(51) Int. Cl.
*B29C 43/36* (2006.01)
*H01L 21/67* (2006.01)

(52) U.S. Cl.
CPC .............................. *H01L 21/67092* (2013.01)

(58) Field of Classification Search
CPC ......... B29C 43/02; B29C 43/04; B29C 43/32; B29C 43/36; B29C 2043/3652; H01L 21/67092
USPC ......................................................... 425/385
See application file for complete search history.

(56) References Cited

U.S. PATENT DOCUMENTS

| 7,213,437 B2 * | 5/2007 | Osumi ..................... B21D 5/00 72/379.2 |
| 2005/0012237 A1 * | 1/2005 | Koyama ................. B29C 43/36 264/161 |
| 2014/0096892 A1 * | 4/2014 | Cho ........................ B32B 37/12 156/99 |

FOREIGN PATENT DOCUMENTS

| KR | 10-2008-0062424 A | 7/2008 |
| KR | 10-2014-0002470 A | 1/2014 |
| KR | 10-2014-0010919 A | 1/2014 |
| KR | 10-2014-0044579 A | 4/2014 |

\* cited by examiner

*Primary Examiner* — Joseph S Del Sole
*Assistant Examiner* — Thu Khanh T Nguyen
(74) *Attorney, Agent, or Firm* — Kile Park Reed & Houtteman PLLC

(57) ABSTRACT

An apparatus for manufacturing a flexible display device, including a first pressing unit including a recess, a window within the recess and having two end portions with a first radius of curvature, the window contacting a display panel, and a second pressing unit facing the first pressing unit, the display panel being between the first and second pressing units, wherein the second pressing unit includes an upper portion having a second radius of curvature and a convex second mounting surface, the second radius of curvature being different from the first radius of curvature, a pressing buffer portion extending from opposite portions of the upper portion and having a third radius of curvature different from the second radius of curvature, a lateral portion connected to the pressing buffer portion, and a lower portion connected to the lateral portion at an obtuse angle.

11 Claims, 6 Drawing Sheets

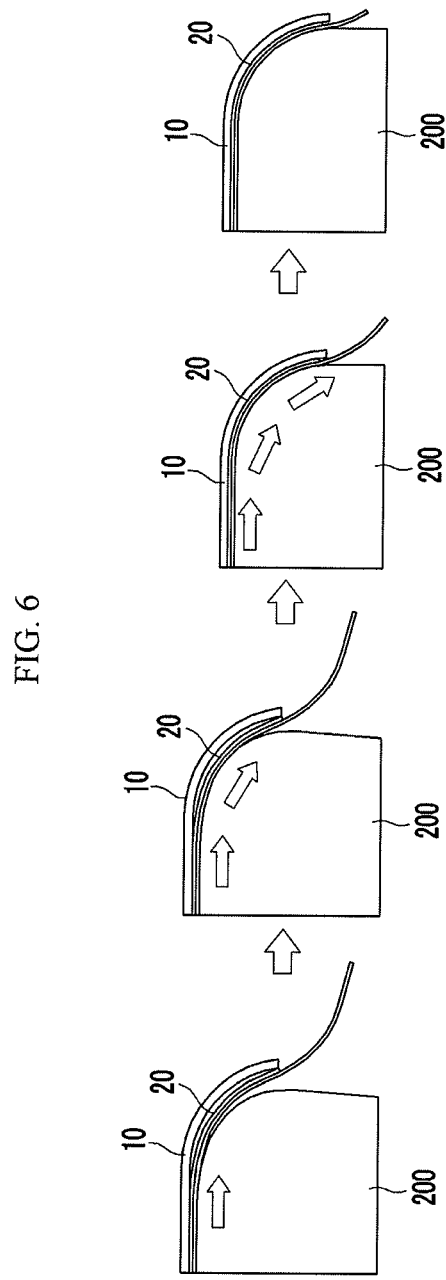

APPARATUS FOR MANUFACTURING FLEXIBLE DISPLAY DEVICE

CROSS-REFERENCE TO RELATED APPLICATION

Korean Patent Application No. 10-2015-0007026, filed on Jan. 14, 2015, in the Korean Intellectual Property Office, and entitled: "Apparatus for Manufacturing Flexible Display Device," is incorporated by reference herein in its entirety.

BACKGROUND

1. Field

The present disclosure relates to an apparatus for manufacturing a flexible display device.

2. Description of the Related Art

Recently, flexible display devices including flexible substrates, which are light in weight and resistant to impact and which are formed of a material such as plastic, have been developed. Such flexible display devices may be folded or rolled in a scroll form, maximizing portability, so as to be utilized in various fields.

A flexible display device includes a display device formed on a flexible substrate. Display devices that may be used in a flexible display device include, e.g., an organic light emitting diode (OLED) display, a liquid crystal display (LCD) device, an electrophoretic display (EPD) device, and the like. These display devices commonly include thin film transistors. Thus, in order to form a flexible display device, the flexible substrate undergoes thin film processes several times.

The flexible substrate, which has undergone the thin film processes, is sealed by an encapsulation substrate. The flexible substrate, the thin film transistors formed on the flexible substrate, and the encapsulation substrate constitute a display panel of the flexible display device.

SUMMARY

Embodiments provide an apparatus for manufacturing a flexible display device, having advantages of bonding a display panel and a window without generating bubbles, or the like, between a display panel and a window bonded to each other.

An exemplary embodiment provides an apparatus for manufacturing a flexible display device including a first pressing unit including a recess, the recess having a first mounting surface, a window positioned within the recess, the window having a shape corresponding to the first mounting surface of the recess, and having two end portions with a first radius of curvature, the window being disposed to contact a first surface of a display panel, and a second pressing unit facing the first pressing unit, the display panel being between the first and second pressing units, and the second pressing unit pressing a second surface of the display panel, wherein the second pressing unit includes an upper portion having a second radius of curvature and a second mounting surface having a convex shape, the second radius of curvature having a value different from that of the first radius of curvature, a pressing buffer portion extending from opposite end portions of the upper portion, the pressing buffer portion having a third radius of curvature with a value different from that of the second radius of curvature, a lateral portion connected to the pressing buffer portion, and a lower portion connected to the lateral portion at an obtuse angle.

The first radius of curvature may be greater than the third radius of curvature, the second radius of curvature may be greater than the first radius of curvature, and the third radius of curvature may be smaller than a value obtained by subtracting a thickness of a laminated module material from the first radius of curvature. The third radius of curvature may be equal to or smaller than 10 mm.

A first angle between the upper portion and the lateral portion of the second pressing unit may be formed as an acute angle, and a second angle between the lateral portion and the lower portion of the second pressing unit is formed as an obtuse angle. The second angle may be equal to or smaller than 120 degrees. The second pressing unit may include a material having shore hardness ranging from 10 to 30, at least the second mounting surface of the second pressing unit may be formed of an elastic member having pressing buffer power, and the elastic member may include one or more among silicon gel, rubber, and urethane foam.

When one surface of the window is in contact with one surface of the display panel, the upper portion and the display panel may come into contact, starting from a central portion of the one surface of the window toward both sides of the display panel in a length direction.

BRIEF DESCRIPTION OF THE DRAWINGS

Features will become apparent to those of ordinary skill in the art by describing in detail exemplary embodiments with reference to the attached drawings, in which:

FIG. 6 illustrates a schematic view of a process of bonding portions of the window and the display panel in the apparatus of FIG. 1.

DETAILED DESCRIPTION

Figure 1:
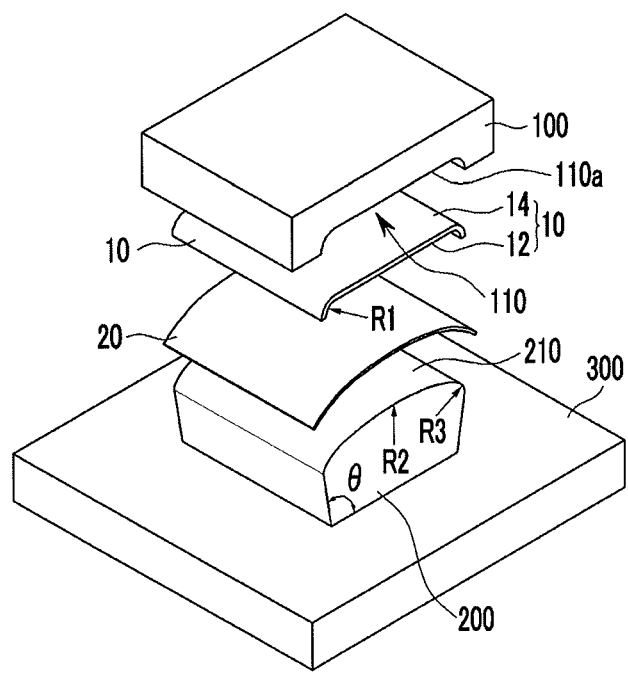
FIG. 1 illustrates an exploded perspective view of an apparatus for manufacturing a flexible display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Singular forms are intended to include plural forms unless the context clearly indicates otherwise. It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

Unless indicated otherwise, it is to be understood that all the terms used in the specification, including technical and scientific terms have the same meaning as those that are understood by those skilled in the art. It must be understood that the terms defined by the dictionary are identical with the meanings within the context of the related art, and they should not be ideally or excessively formally defined unless the context clearly dictates otherwise.

FIG. 1 is an exploded perspective view of an apparatus for manufacturing a flexible display device according to an exemplary embodiment. Referring to FIG. 1, an apparatus for manufacturing a flexible display device according to an exemplary embodiment may includes a first pressing unit 100 and a second pressing unit 200.

In detail, the first pressing unit 100 includes a recess 110 having a first mounting surface 110a corresponding to, e.g., facing, a first surface 14 of a window 10. The first pressing unit 100 is formed such that a portion thereof is curved, and has the first mounting surface 110a coupled with the first surface 14 of the window 10. The first pressing unit 100 may be formed such that at least the first mounting surface 110a has a shape corresponding to the shape of the window 10. The first mounting surface 110a of the first pressing unit 100 may be formed as a curved surface having a preset curvature. The curvature of the first mounting surface 110a may be different according to relative positions on the first mounting surface 110a, e.g., one portion of the first pressing unit 100 may be flat and another portion may be curved to allow a curved portion of the window 10 to be mounted thereon.

The window 10 may be formed to have the first surface 14 and a second surface 12 opposite the first surface 14. The second surface 12 is in contact with a first surface 22 (FIG. 3) of the display panel 20, and at least both end portions of the window 10 in a length direction have a preset first radius of curvature R1 and have a concave shape. The window 10 may be formed of various types of materials, e.g., glass or plastic. Materials used to form the window 10 may not be limited and any material may be used as long as it allows a portion of the window 10 to be curved.

The second pressing unit 200 is disposed in a position facing the first pressing unit 100 with a pressing space therebetween. The display panel 20 may be interposed between the first and second pressing units 100 and 200, e.g., a second mounting surface 210 of the second pressing unit 200 may face a second surface 24 (FIG. 3) of the display panel 20. The second pressing unit 200 serves to press the window 10 and the display panel 20 or release pressing the window 10 and the display panel 20 through an operation of moving toward or moving away from the first pressing unit 100. The second pressing unit 200 may be installed on a support unit 300. The second pressing unit 200 may be detachably installed on the support unit 300. Thus, various types of second pressing unit 200 may be exchangeably installed on the support unit 300. The second mounting surface 210 of the second pressing unit 200 may have a curved surface identical to the curved surface of the first mounting surface 110a of the first pressing unit 100, e.g., the first mounting surface 110a and the second mounting surface 120 may be complementary shaped. Also, the curved surface of the second pressing unit 200 may be formed across the second mounting surface and protrude toward the first pressing unit 100. The second surface 24 of the display panel 20 may be mounted on the second mounting surface 210 of the second pressing unit 200. Here, the display panel 20 may include a touch panel and may be formed to be flexible.

As described above, in order to improve a bonding relationship between the display panel 20 and the window 10, e.g., intended to be bonded when laminated, the apparatus for manufacturing a flexible display device according to an exemplary embodiment bonds the display panel 20 and the window 10, starting from the inner, e.g., central, side of the window 10 toward edge portions through the curved portions. That is, the apparatus for manufacturing a flexible display device according to an exemplary embodiment bonds the display panel 20 and the window 10 by pressing the first pressing unit 100 toward the second pressing unit 200, such that an initial contact between the display panel 20 and the window 10 is at a region corresponding to centers of the first and second pressing units 100 and 200, and the contact gradually spreads from the center towards edges of the centers of the first and second pressing units 100 and 200. Thus, generation of bubbles may be prevented or substantially minimized, thereby improving quality.

Figure 2:
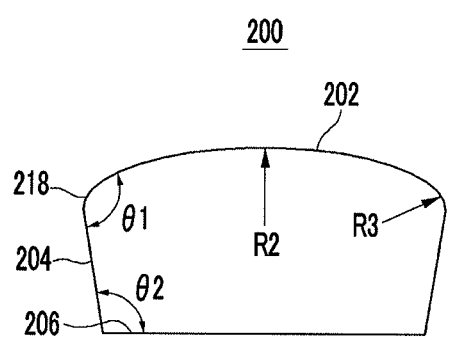
FIG. 2 illustrates a schematic view of a second pressing unit of FIG. 1.

FIG. 2 is a view illustrating the second pressing unit 200 of FIG. 1. Referring to FIG. 2, the second pressing unit 200 includes an upper portion 202, a pressing buffer portion 218, and a lower portion 206.

The upper portion 202 may have a second radius of curvature R2 and, when the second surface 12 of the window 10 is in contact with the first surface 22 of the display panel 20, a central portion of the second surface 12 of the window 10 starts curving to be brought into contact toward both sides of the display panel 20 in the length direction. Here, a distance between a peak of the convex upper surface of the second pressing unit 200 and a virtual point at which the upper surface and a lateral surface meet may be 10 mm or smaller.

The pressing buffer portion 218 may have a third radius of curvature R3 set in the corner between the upper portion 202 and a lateral portion 204 connected to the upper portion 202. Here, the first radius of curvature R1, the second radius of curvature R2, and the third radius of curvature R3 may be set to be different. For example, the first radius of curvature R1 may be greater than the third radius of curvature R3, and the second radius of curvature R2 may be grater than the first radius of curvature R1.

The first radius of curvature R1 may be set to be greater than about 6 mm. If the first radius of curvature R1 of the window 10 were equal to or smaller than 6 mm, deformation of the lower portion 206 would be greater than deformation of the upper portion 202 of the second pressing unit 200, and thus, the lower portion 206 would be spread more than the upper portion 202. In this case, the edge portion would first brought into contact so as not to be bonded, thereby generating bubbles.

The third radius of curvature R3 may be set to be smaller than a value obtained by subtracting a thickness of a laminated module material from the first radius of curvature R1. That is, the third radius of curvature R3 formed in the pressing buffer portion 218 between the upper surface and the lateral surface of the second pressing unit 200 may be set to a value smaller than a value obtained by subtracting an overall thickness of a lamination module from the first radius of curvature R1 as an inner radius of curvature of the window 10, i.e., (third radius of curvature R3)≤(first radius of curvature R1−overall thickness of lamination module material). In this case, the third radius of curvature R3 may be set to be equal to or smaller than about 10 mm according to a result of structure analysis. If the third radius of curvature R3 were greater than 10 nm, the edge portion of the curved surface would start to come into line contact to generate bubbles in the corresponding portion.

Meanwhile, a first angle θ1 between the upper portion 202 and the lateral portion 204 of the second pressing unit 200 is formed as an acute angle, e.g., the first angle θ1 may be defined as an angle between intersection of extensions lines of the upper portion 202 and the lateral portion 204 if they were not curved. A second angle θ2 between the lateral portion 204 and the lower portion 206 of the second pressing unit 200 may be formed as an obtuse angle. Here, the second angle θ2 may be formed as an obtuse angle equal to or smaller than 120 degrees. The second angle θ2 may be formed as an obtuse angle between about 95 degrees to 105 degrees with reference to the result of structure analysis. As described above, since the first angle θ1 is formed as an acute angle and the second angle θ2 is formed as an obtuse angle, the second pressing unit 200 according to the third radius of curvature R3 may be commonly applied regardless of the first radius of curvature R1 as an inner radius of curvature of the window 10. Also, a degree of freedom of design with respect to the third radius of curvature R3 is facilitated and deformation of the lower portion of the second pressing unit 200 can be reduced.

For example, the second pressing unit 200 may include a material having shore hardness ranging from 10 to 30, e.g. a material having shore hardness ranging from 15 to 20. The second pressing unit 200 may be formed of an elastic member allowing at least the second mounting surface to have pressing buffer power. The elastic member may include one or more of silicon gel, rubber, and urethane foam. As described above, by improving the shape and material of the second pressing unit 200, the display panel 20 intended to be bonded when laminated can be naturally bonded, starting from an inner side of the window 10 toward the edge portions thereof through the curved portion. The second pressing unit 200 may be formed of an elastic material having restoring force, and thus, when the first pressing unit 100 and the second pressing unit 200 are separated, the second pressing unit 200 may be restored to have a shape with a preset radius of curvature. Herein, shore hardness measured by the type D durometer according to ASTM D-2240.

In contrast, if the second pressing unit 200 were to be formed of a metal, e.g., magnesium, aluminum, or the like, or were to be formed to have a structure including a cushion material only in a portion of an upper surface thereof, during lamination of the window 10 and the display panel 20, the curved edge portions would first come into contact, thereby generating bubbles due to non-bonding or weak bonding between the curved portion of the window 10 and the display panel 20 to degrade quality of the display panel 20. Thus, according to example embodiments, the second pressing unit 200 is formed of an elastic material so as to be laminated even in a state smaller than the preset radius of curvature. The second pressing unit 200 may be entirely formed of an elastic material having restoring force, or only a region in contact with the display panel 20 may be formed of an elastic material, i.e., other portions may be formed of any other material.

Figure 3:
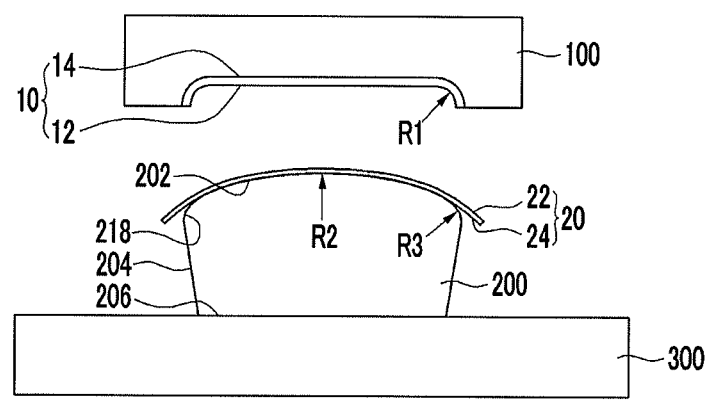
FIG. 3 illustrates a schematic view of a state before a window and a display panel are bonded in the apparatus of FIG. 1.
Figure 4:
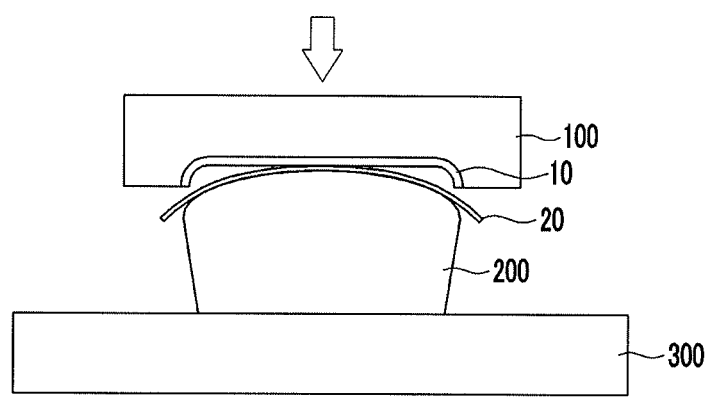
FIG. 4 illustrates a schematic view of a state in which the window and the display panel start to be bonded from central portions thereof in the apparatus of FIG. 1.
Figure 5:
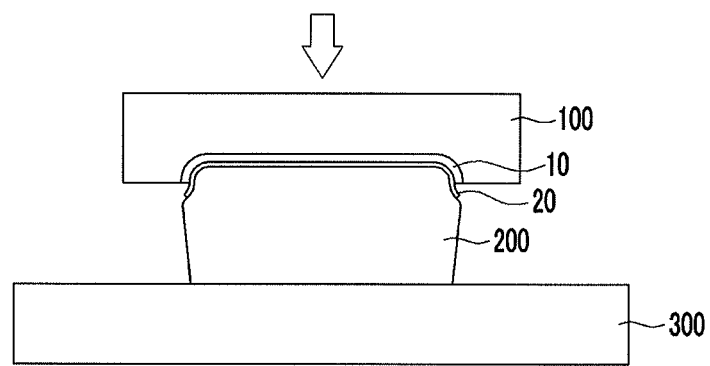
FIG. 5 illustrates a schematic view of a state in which the window and the display panel are completely bonded in the apparatus of FIG. 1.

FIG. 3 is a view illustrating a state before the window 10 and the display panel 20 are bonded, in the apparatus for manufacturing a flexible display device according to an exemplary embodiment, and FIG. 4 is a view illustrating a state in which the window 10 and the display panel 20 start to be bonded from central portions thereof, in the apparatus for manufacturing a flexible display device according to an exemplary embodiment. FIG. 5 is a view illustrating a state in which the window 10 and the display panel 20 are completely bonded, in the apparatus for manufacturing a flexible display device according to an exemplary embodiment, and FIG. 6 is a view illustrating a process of bonding portions of the window 10 and the display panel 20, in the apparatus for manufacturing a flexible display device according to an exemplary embodiment.

A process of bonding the window 10 and the display panel 20 by using the apparatus for manufacturing a flexible display device according to an exemplary embodiment will be described with reference to FIGS. 1 through 6. Before describing the process of bonding the window 10 and the display panel 20, the apparatus for manufacturing a flexible display device according to an exemplary embodiment may further include a driving unit connected to at least one of the first pressing unit 100 and the second pressing unit 200 to generate a pressing driving force. The driving unit may include a first driving unit connected to the first pressing unit 100 and a second driving unit connected to the second pressing unit 200. The driving unit may include a cylinder operating by air pressure or hydraulic pressure, and may also include a motor driven with electrical energy. Hereinafter, for the purposes of description with respect to the characteristics of the shape and material of the second pressing unit 200, it is assumed that the first pressing unit 100 is disposed to be movable in a vertical direction, and a detailed description of the driving unit will be omitted. Also, detailed descriptions overlapping with those of a general apparatus and method for manufacturing a display panel will also be omitted in describing the present disclosure in detail.

As illustrated in FIG. 3, the window 10 is mounted on the first pressing unit 100, and the display panel 20 is mounted on the second pressing unit 200. The first mounting surface of the first pressing unit 100 is formed as a curved surface, and the first surface 14 of the window 10 may be tightly attached thereto. The second surface 24 of the display panel 20 may be mounted on the second mounting surface of the second pressing unit 200.

Referring to FIG. 4, when the window 10 and the display panel 20 are completely ready to be bonded, the driving unit may be driven to move the first pressing unit 100 in a pressing direction, e.g., downwardly. When it is assumed that the first driving unit operates, the first pressing unit 100 may move in a direction toward the second pressing unit 200 disposed with a pressing space therebetween. Subsequently, when the first pressing unit 100 moves toward the second pressing unit 200, the second surface 12 of the window 10 comes into contact with the fist surface 22 of the display panel 20.

Further, as illustrated in FIG. 5, a central portion of the second surface 12 of the window 10 starts to press against a central portion of the display panel 20 and a central portion of a top of the second pressing unit 200, so the display panel 20 and the top of the second pressing unit 200 fit against the window 10 in the recess of the first pressing unit 100. As such, after contacting the central portion of the display panel 20, the second surface 12 of the window 10 also comes into contact with both sides, e.g., edges, of the display panel 20 in the length direction.

When the display panel 20 and the window 10 are compressed by pressing and driving the first pressing unit 100 and the second pressing unit 200, the pressing buffer portion 218 of the second pressing unit 200 distributes a partial amount of the pressing force applied to the display panel 20 and the window 10. Also, the pressing buffer portion 218 of the second pressing unit 200 may absorb a partial amount of the pressing force applied to the display unit 20 and the window 10, thus preventing damage to the display panel 20 and the window 10. Thus, the display panel 20 and the window 10 may be bonded through lamination without generating bubbles. That is, as described above, when the window 10 and the display panel 20 are bonded from the center thereof toward the edges, generation of bubbles between the window 10 and the display panel 20 may be suppressed, and thus, the display panel 20 having a shape of a curved surface can be rapidly and accurately manufactured. Also, since the window 10 and the display panel 20 having the shape of the curved surface adhere accurately, a defect rate can be minimized and quality of product can be enhanced.

Referring to FIG. 6, the pressing buffer portion 218 of the second pressing unit 200 buffers and supports the display panel 20 pressed with the window 10 to prevent bubbles generated between the display panel 20 and the second mounting surface of the second pressing unit 200 or between the display panel 20 and the window 10 when the second pressing unit 200 and the first pressing unit 100 are compressed. For example, bubbles potentially generated in a curved portion formed in a pressing space between the first pressing unit 100 and the second pressing unit 200 when the display panel 20 and the window are laminated may be prevented, thereby preventing or substantially minimizing quality degradation of product due to bubble generation in the portion where the window 10 and the display panel 20 are compressed. Thus, the display panel 20 having a shape of a curved surface can be rapidly and easily manufactured. Also, since the window 10 and the display panel 20 adhere accurately, a defect rate can be minimized.

By way of summation and review, a flexible display device is manufactured by attaching a display panel to a lower portion of a window protecting the display panel. For example, a double-sided tape type optical clear adhesive (OCA) may be interposed between the display panel and the window to bond the display panel and the window. However, in the process of bonding the display panel to a lower surface of the window, an upper surface of the display panel and the lower surface of the window may be non-uniformly bonded, thereby generating bubbles between the display panel and the window. Such bubbles generated between the display panel and the window cause a defect in the process of manufacturing the flexible display device.

In contrast, according to example embodiments, an apparatus for manufacturing a flexible display device may prevent generation of bubbles in a non-bonding portion when the display panel and the window are bonded, and may be implemented such that the subsidiary material intended to be bonded when laminated naturally bonded, starting from an inner side of the window toward the edge portions thereof through the curved portion. As such, generation of bubbles in a portion where the window and the display panel are bonded is prevented, maintaining uniform bonding of the window and display panel, thus securing reliability of a product. Also, since a product can be manufactured accurately and rapidly by preventing a phenomenon in which bubbles are generated when the window and the display panel are bonded, a manufacturing operation time can be shortened and manufacturing cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing a flexible display device, the apparatus comprising:
   a first pressing unit including a recess, the recess having a first mounting surface;
   a window positioned within the recess, the window having a shape corresponding to the first mounting surface of the recess, and having two end portions with a first radius of curvature, the window being disposed to contact a first surface of a display panel; and
   a second pressing unit facing the first pressing unit, the display panel being between the first and second pressing units, and the second pressing unit pressing a second surface of the display panel,
   wherein the second pressing unit includes:
      an upper portion having a second mounting surface facing the first mounting surface of the first pressing unit, the second mounting surface having a convex shape with a second radius of curvature, the second radius of curvature having a value different from that of the first radius of curvature,
      a pressing buffer portion having third mounting surfaces, the third mounting surfaces extending from opposite end portions of the convexly shaped second mounting surface of the upper portion, each of the third mounting surfaces of the pressing buffer portion curving downwardly from the second mounting surface and having a third radius of curvature with a value different from that of the second radius of curvature,
      a lateral portion connected to the pressing buffer portion, and a lower portion connected to the lateral portion at an obtuse angle, wherein,
   at least the second mounting surface of the second pressing unit includes an elastic member having pressing buffer power,
   wherein the window between the two end portions has a flat shape and the display panel at the upper portion of the second mounting surface has a convex shape such that when the window and the display panel are brought into contact with each other, a first contact is made between a central portion of the window between the two end portions and a peak of the upper portion of the second mounting surface having the convex shape, and when the first pressing unit and the second pressing unit are further pressed toward each other, an area of contact between the window and the display panel spreads outwardly from the first contact to opposite sides of the display panel in a length direction,
   when the first and second pressing units are not in contact with each other via the window, shapes of the first and second mounting surfaces are not complementary with each other, and when after the first pressing unit contacts and presses against the second pressing unit via the window from a central portion of the second mounting surface toward edges of the second mounting surface, the second mounting surface is deformed so that a shape of the second mounting surface becomes complementary with respect to the first mounting surface.

2. The apparatus as claimed in claim 1, wherein the first radius of curvature is greater than the third radius of curvature, and the second radius of curvature is greater than the first radius of curvature.

3. The apparatus as claimed in claim 2, wherein the third radius of curvature is smaller than a value obtained by subtracting a thickness of a laminated module material from the first radius of curvature.

4. The apparatus as claimed in claim 3, wherein the third radius of curvature is equal to or smaller than about 10 mm.

5. The apparatus as claimed in claim 1, wherein a first angle between the upper portion and the lateral portion of the second pressing unit is an acute angle.

6. The apparatus as claimed in claim 5, wherein a second angle between the lateral portion and the lower portion of the second pressing unit is the obtuse angle.

7. The apparatus as claimed in claim 6, wherein the second angle is equal to or smaller than about 120 degrees.

8. The apparatus as claimed in claim 1, wherein the elastic member includes one or more of silicon gel, rubber, and urethane foam.

9. The apparatus as claimed in claim 1, wherein, when the first and second pressing units are not in contact with each other via the window, the second mounting surface is convex, and a portion of the first mounting surface facing the second mounting surface is flat.

10. The apparatus as claimed in claim 1, wherein:
the lower portion is a flat bottom of the second pressing unit, and
the lateral portion includes a lateral surface connecting the bottom of the second pressing unit to each of the third mounting surfaces, the obtuse angle being an inner angle between the bottom of the second pressing unit and the lateral surface.

11. The apparatus as claimed in claim 10, wherein a total length of the second and third mounting surfaces, as viewed in a cross-sectional view, is longer than a length of the bottom of the second pressing unit, as viewed in a cross-sectional view.

* * * * *